(12) United States Patent
Plocher et al.

(10) Patent No.: US 8,990,049 B2
(45) Date of Patent: Mar. 24, 2015

(54) BUILDING STRUCTURE DISCOVERY AND DISPLAY FROM VARIOUS DATA ARTIFACTS AT SCENE

(75) Inventors: Tom Plocher, Hugo, MN (US); Henry Chen, Beijing (CN)

(73) Assignee: Honeywell International Inc., Morristown, NJ (US)

(*) Notice: Subject to any disclaimer, the term of this patent is extended or adjusted under 35 U.S.C. 154(b) by 738 days.

(21) Appl. No.: 12/772,310

(22) Filed: May 3, 2010

(65) Prior Publication Data

US 2011/0270584 A1 Nov. 3, 2011

(51) Int. Cl.
*G06F 17/50* (2006.01)

(52) U.S. Cl.
CPC .................... *G06F 17/5004* (2013.01)
USPC ............................................................ 703/1

(58) Field of Classification Search
CPC .................................................. G06F 17/5004
USPC ............................................................ 703/1
See application file for complete search history.

(56) References Cited

U.S. PATENT DOCUMENTS

| | | | |
|---|---|---|---|
| 5,719,561 A | 2/1998 | Gonzales | |
| 5,745,126 A | 4/1998 | Jain et al. | |
| 5,857,986 A | 1/1999 | Moriyasu | |
| 6,006,161 A | 12/1999 | Katou | |
| 6,334,211 B1 | 12/2001 | Kojima et al. | |
| 6,522,266 B1 * | 2/2003 | Soehren et al. | 340/988 |
| 6,710,706 B1 | 3/2004 | Withington et al. | |
| 6,720,921 B2 | 4/2004 | Ripingill, Jr. et al. | |
| 6,876,951 B2 | 4/2005 | Skidmore et al. | |
| 6,900,762 B2 | 5/2005 | Andrews et al. | |
| 6,924,787 B2 | 8/2005 | Kramer et al. | |
| 6,965,312 B2 | 11/2005 | Lerg | |

(Continued)

FOREIGN PATENT DOCUMENTS

| | | |
|---|---|---|
| GB | 2441434 | 5/2008 |
| JP | 11024735 | 1/1999 |

(Continued)

OTHER PUBLICATIONS

Edward J. Baranoski, "New Sensor Signal Processor Paradigms: When One Pass Isn't Enough," 2008, HPEC 2008 (High Performance Embedded Computing), 19 pages.*

(Continued)

*Primary Examiner* — Kamini S Shah
*Assistant Examiner* — Russ Guill
(74) *Attorney, Agent, or Firm* — Seager Tufte & Wickhem LLC.

(57) ABSTRACT

An approach for developing information about a building of which little or no information is known at a time when firefighters need to enter the building. The approach may incorporate obtaining an image of the building from a publicly available resource. An outside boundary of the building may be determined from the image. The number of floors may be determined. A 3D floor plan may be generated from the boundary and the number of floors. Structural components may be added to the 3D floor plan, which are deduced from movements of firefighters, and the movements may be deduced from their locations. The locations may be transmitted by devices on the firefighters. Structural components of the building indicated by persons in the vicinity of the building may also be added to the 3D floor plan.

13 Claims, 10 Drawing Sheets

(56) References Cited

U.S. PATENT DOCUMENTS

| | | | |
|---|---|---|---|
| 7,002,551 B2 | 2/2006 | Azuma et al. |
| 7,062,722 B1 | 6/2006 | Carlin et al. |
| 7,096,120 B2 | 8/2006 | Hull |
| 7,102,510 B2 | 9/2006 | Boling et al. |
| 7,111,783 B2 | 9/2006 | Xi et al. |
| 7,132,928 B2 | 11/2006 | Perricone |
| 7,139,685 B2 | 11/2006 | Bascle et al. |
| 7,146,218 B2 | 12/2006 | Esteller et al. |
| 7,164,972 B2 | 1/2007 | Imhof et al. |
| 7,200,639 B1 | 4/2007 | Yoshida |
| 7,246,008 B2 | 7/2007 | Daubert et al. |
| 7,246,044 B2 | 7/2007 | Imamura et al. |
| 7,292,908 B2 | 11/2007 | Borne et al. |
| 7,301,648 B2 | 11/2007 | Foxlin |
| 7,304,442 B2 | 12/2007 | Colwell |
| 7,308,323 B2 | 12/2007 | Kruk et al. |
| 7,342,648 B2 | 3/2008 | Solomon et al. |
| 7,358,458 B2 | 4/2008 | Daniel |
| 7,359,840 B2 | 4/2008 | Akasaka et al. |
| 7,382,281 B2 | 6/2008 | Kavaler |
| 7,383,148 B2 | 6/2008 | Ahmed |
| 7,389,207 B2 * | 6/2008 | Saitta ................ 703/1 |
| 7,420,510 B2 | 9/2008 | Kolavennu et al. |
| 7,496,445 B2 | 2/2009 | Mohsini et al. |
| 7,512,450 B2 | 3/2009 | Ahmed |
| 7,523,022 B2 | 4/2009 | Thomas et al. |
| 7,545,263 B2 | 6/2009 | Plocher et al. |
| 7,548,833 B2 | 6/2009 | Ahmed |
| 7,567,844 B2 | 7/2009 | Thomas et al. |
| 7,583,275 B2 | 9/2009 | Neumann et al. |
| 7,596,473 B2 | 9/2009 | Hansen et al. |
| 7,606,579 B2 | 10/2009 | Thacher |
| 7,610,910 B2 | 11/2009 | Ahmed |
| 7,612,832 B2 | 11/2009 | Zhang et al. |
| 7,664,574 B2 | 2/2010 | Imhof et al. |
| 7,683,793 B2 | 3/2010 | Li et al. |
| 7,715,980 B2 | 5/2010 | Bargeron et al. |
| 7,733,836 B2 | 6/2010 | Huseth |
| 7,764,220 B1 * | 7/2010 | Samaniego ................ 342/25 A |
| 7,774,075 B2 | 8/2010 | Lin |
| 7,777,666 B2 | 8/2010 | Gregory et al. |
| 7,830,250 B2 | 11/2010 | Huseth et al. |
| 7,962,150 B2 | 6/2011 | Hertzog et al. |
| 7,973,669 B2 | 7/2011 | Pham et al. |
| 7,982,614 B2 | 7/2011 | Holm et al. |
| 8,000,892 B2 | 8/2011 | Banerjee |
| 8,040,273 B2 * | 10/2011 | Tomich et al. ................ 342/22 |
| 8,041,744 B2 | 10/2011 | Heikkonen et al. |
| 8,089,407 B2 | 1/2012 | Chen et al. |
| 8,102,423 B2 | 1/2012 | Cheng |
| 8,279,119 B2 | 10/2012 | Elwell, Jr. et al. |
| 8,289,390 B2 | 10/2012 | Aggarwal et al. |
| 8,352,218 B2 | 1/2013 | Balla et al. |
| 2002/0055384 A1 | 5/2002 | Armstrong |
| 2003/0083957 A1 | 5/2003 | Olefson |
| 2003/0214397 A1 * | 11/2003 | Perkins et al. ................ 340/524 |
| 2003/0214400 A1 | 11/2003 | Mizutani et al. |
| 2003/0214410 A1 * | 11/2003 | Johnson et al. ............ 340/573.4 |
| 2004/0021569 A1 | 2/2004 | Lepkofker et al. |
| 2004/0233192 A1 | 11/2004 | Hopper |
| 2005/0010460 A1 | 1/2005 | Mizoguchi et al. |
| 2005/0033200 A1 * | 2/2005 | Soehren et al. ............ 600/595 |
| 2005/0264558 A1 | 12/2005 | Vesely et al. |
| 2005/0267900 A1 | 12/2005 | Ahmed et al. |
| 2006/0009862 A1 | 1/2006 | Imhof et al. |
| 2006/0029256 A1 | 2/2006 | Miyoshi et al. |
| 2006/0044307 A1 | 3/2006 | Song |
| 2006/0061752 A1 * | 3/2006 | Solomon et al. ............ 356/4.03 |
| 2006/0073455 A1 | 4/2006 | Buyl et al. |
| 2006/0265664 A1 | 11/2006 | Simons et al. |
| 2006/0284979 A1 * | 12/2006 | Clarkson ................ 348/143 |
| 2007/0001904 A1 | 1/2007 | Mendelson |
| 2007/0201421 A1 | 8/2007 | Huseth |
| 2007/0205886 A1 | 9/2007 | Huseth et al. |
| 2007/0239350 A1 | 10/2007 | Zumsteg et al. |
| 2007/0239352 A1 | 10/2007 | Thota et al. |
| 2007/0250261 A1 * | 10/2007 | Soehren ................ 701/207 |
| 2007/0279210 A1 | 12/2007 | Li et al. |
| 2008/0033645 A1 | 2/2008 | Levinson et al. |
| 2008/0040669 A1 | 2/2008 | Plocher et al. |
| 2008/0062167 A1 | 3/2008 | Boggs et al. |
| 2008/0068267 A1 | 3/2008 | Huseth et al. |
| 2008/0077326 A1 | 3/2008 | Funk et al. |
| 2008/0122696 A1 | 5/2008 | Huseth et al. |
| 2008/0158256 A1 | 7/2008 | Russell et al. |
| 2008/0215524 A1 | 9/2008 | Fuchs et al. |
| 2008/0220780 A1 | 9/2008 | Huseth et al. |
| 2008/0228039 A1 | 9/2008 | Huseth et al. |
| 2009/0040175 A1 | 2/2009 | Xu et al. |
| 2009/0043504 A1 * | 2/2009 | Bandyopadhyay et al. .. 701/213 |
| 2009/0044808 A1 | 2/2009 | Guney et al. |
| 2009/0046140 A1 | 2/2009 | Lashmet et al. |
| 2009/0105006 A1 | 4/2009 | Doyle |
| 2009/0207067 A1 * | 8/2009 | Samaniego et al. ............ 342/22 |
| 2009/0216438 A1 | 8/2009 | Shafer |
| 2009/0216775 A1 | 8/2009 | Ratliff et al. |
| 2009/0265104 A1 | 10/2009 | Shroff |
| 2009/0298024 A1 | 12/2009 | Batzler et al. |
| 2009/0307255 A1 | 12/2009 | Park |
| 2010/0057354 A1 | 3/2010 | Chen et al. |
| 2010/0121567 A1 | 5/2010 | Mendelson |
| 2010/0234693 A1 * | 9/2010 | Srinivasan et al. ............ 600/300 |
| 2010/0299065 A1 | 11/2010 | Mays |
| 2011/0059698 A1 | 3/2011 | Huseth et al. |
| 2011/0082643 A1 | 4/2011 | Huseth et al. |
| 2011/0112875 A1 | 5/2011 | Johnson et al. |
| 2011/0137549 A1 | 6/2011 | Gupta et al. |
| 2011/0153279 A1 | 6/2011 | Zhang et al. |
| 2011/0164768 A1 | 7/2011 | Huseth et al. |
| 2011/0248847 A1 | 10/2011 | Huseth et al. |
| 2011/0268300 A1 | 11/2011 | Plocher et al. |
| 2011/0270654 A1 | 11/2011 | Banerjee et al. |
| 2011/0276264 A1 | 11/2011 | Plocher et al. |
| 2011/0285851 A1 | 11/2011 | Plocher et al. |
| 2012/0130632 A1 | 5/2012 | Bandyopadhyay et al. |
| 2012/0143495 A1 | 6/2012 | Dantu |
| 2012/0169530 A1 | 7/2012 | Padmanabhan et al. |
| 2012/0173204 A1 | 7/2012 | Padmanabhan et al. |
| 2012/0194517 A1 | 8/2012 | Izadi et al. |
| 2012/0319903 A1 | 12/2012 | Huseth et al. |

FOREIGN PATENT DOCUMENTS

| | | |
|---|---|---|
| JP | 11317936 | 11/1999 |
| JP | 2001356813 | 12/2001 |
| JP | 2005242531 | 9/2005 |
| JP | 2005311563 | 11/2005 |
| JP | 2007183432 A | 7/2007 |
| JP | 2007333998 A | 12/2007 |
| WO | WO 92/10953 | 7/1992 |
| WO | WO 2005/033912 | 4/2005 |
| WO | WO 2005/040989 | 5/2005 |
| WO | WO 2009/029834 | 3/2009 |
| WO | WO 2009/071919 | 6/2009 |
| WO | 2010107379 A1 | 9/2010 |

OTHER PUBLICATIONS

Ruisheng Wang et al., "Camera localization and building reconstruction from single monocular images," 2008, IEEE Computer Society Conference on Computer Vision and Pattern Recognition Workshops 2008, eight pages.*

Noah Snavely et al., "Modeling the world from internet photo collections," 2008, International Journal of Computer Vision, vol. 80, issue 2, Springer, pp. 189-210.*

Vijay Kumar et al., "Robot and sensor networks for first responders," 2004, Pervasive Computing, Oct.-Dec. 2004, pp. 24-33.*

Matthew Johnston et al., "Estimating building floor-plans from exterior using laser scanners," 2008, Three-Dimensional Image Capture and Applications 2008, Proceedings SPIE 6805, pp. 1-11.*

Carl Fischer et al., "Location and navigation support for emergency responders: a survey," Jan. 2010, Pervasive Computing, vol. 9, issue 1, pp. 38-47.*

(56) References Cited

OTHER PUBLICATIONS

Burcu Cinaz et al., "HeadSLAM—Simultaneous Localization and Mapping with Head-Mounted Inertial and Laser Range Sensors," 2008, 12th IEEE International Symposium on Wearable Computers, pp. 3-10.*

Angela Budroni et al., "Automated 3D Reconstruction of Interiors from Point Clouds," Mar. 2010, International Journal of Architectural Computing, vol. 8, issue 1, pp. 55-73.*

"Incident management IPT requirements BAA for topics related to geospatial location accountability and navigation system for emergency responders (GLANSER)," Jan. 2009, Department of Homeland Security, pp. 1-34.*

Jiann-Yeou Rau et al., "Geometrical building modeling and its application to the ortho-rectification for aerial images," 2004, Journal of Photogrammetry and Remote Sensing, vol. 9, No. 1, pp. 53-76.*

Rob Margetta, "3-d locator featured at Washington tech. demonstration," Jun. 20, 2008, http://www.firerescue1.com/fire-products/incident-management/articles/405845-3-D-locator-featured-at-Washington-tech-demonstration/, pp. 1-3.*

Honeywell, "Personal Navigation for First Responders," Aug. 3, 2009, Worcester Polytechnic Institute, 20 pages.*

A.J. Davison, "Real-time simultaneous localisation and mapping with a single camera," 2003, Proceedings of the Ninth IEEE International Conference on Computer Vision, pp. 1-8.*

Calvin Le et al., "Ultrawideband (UWB) radar imaging of building interior: measurements and predictions," May 2009, IEEE Transactions on Geoscience and Remote Sensing, vol. 47, No. 5, pp. 1409-1420.*

Davies et al., "Scalable, Distributed, Real-Time Map Generation," IEEE, Intelligent Transport Systems, pp. 47-54, 2006.

http://www.sara.com/ISR/low_frequency_EM/magnetic_communication.html, "Magnetic Communications," 2 pages, Jun. 27, 2011.

Matsumoto, "Real-Time Multi-Sensor Localisation and Mapping Algorithms for Mobile Robots," 309 pages, 2009.

Yagi et al., "Real-Time Generation of Environmental Map and Obstacle Avoidance Using Omnidirectional Image Sensor with Conic Mirror," IEEE, pp. 160-165, 1991.

U.S. Appl. No. 12/573,398, filed Oct. 5, 2009.
U.S. Appl. No. 12/773,688, filed May 4, 2010.
U.S. Appl. No. 12/771,252, filed Aril 30 2010.
U.S. Appl. No. 12/783,770, filed May 20, 2010.

Engineering Acoustics, Inc., "Tactor Interface/Controller Advanced Evaluation Board Eval.2.0," 2 pages, prior to Apr. 30, 2010.

Walker et al., "Development and Evaluation of a System for Wearable Audio Navigation," Proceedings of the Human Factors and Ergonomics Society 49th Annual Meeting, pp. 1607-1609, 2005.

U.S. Appl. No. 13/538,677, filed Jun. 29, 2012.

Henke, "The Table Metaphor: A Representation of a Class and Its Instances," pp. 93-98, prior to Dec. 23, 2009.

Honeywell, "Excel Building Supervisor-Integrated R7044 and FS90 Ver. 2.0," Operator Manual, 70 pages, Apr. 1995.

http://kpogre.sourceforge.net/tutoria103/index.html, "Create Tabe Using Wizard," 8 pages, printed Oct. 18, 2009.

http://uic.edu/depts/accc/seminars/access2000-intro/tables.html, "Creating Tables with the Table Wizard-Access 2000 Introduction," 3 pages, Oct. 18, 2009.

Le et al., "Ultrawideband (UWB) Radar Imaging of Building Interior: Measurements and Predictions," IEEE Transactions on Geoscience and Remote Sensing, vol. 47, No. 5, pp. 1409-1420, May 2009.

Rashidi, "Smart Home Adaptation Based on Explicit and Implicit User Feedback," 166 pages, Dec. 2007.

Sacks et al., "A Project Model for an Automated Building System: Design and Planning Phases," Automation in Construction, vol. 7, pp. 21-34, 1997.

Trane, "System Programming, Tracer Summit Version 14, BMTW-SVP01D-EN," 623 pages, 2002. (This reference will be uploaded in 3 parts).

www.automatedbuildings.com/news/may10/articles/lavelleenergy/1004271046061avelle.htm, "Virtual Building Energy Management Moving to Cloud-based Building Energy Management," 7 pages, May 2010.

* cited by examiner

BUILDING STRUCTURE DISCOVERY AND DISPLAY FROM VARIOUS DATA ARTIFACTS AT SCENE

BACKGROUND

The invention pertains to buildings and particularly to their structures. The invention more particularly pertains to determining structural components of a building.

SUMMARY

The invention is an approach for developing information about a building of which little or no information is known at a time when firefighters need to enter the building. The approach may incorporate obtaining an image of the building from a publicly available resource. An outside boundary of the building may be determined from the image. The number of floors may be determined. A 3D floor plan may be generated from the boundary and the number of floors. Structural components may be added to the 3D floor plan, which are deduced from movements of firefighters, and the movements may be deduced from their locations. The locations may be transmitted by devices on the firefighters. Structural components of the building indicated by persons in the vicinity of the building may also be added to the 3D floor plan.

DESCRIPTION

Figure 1:
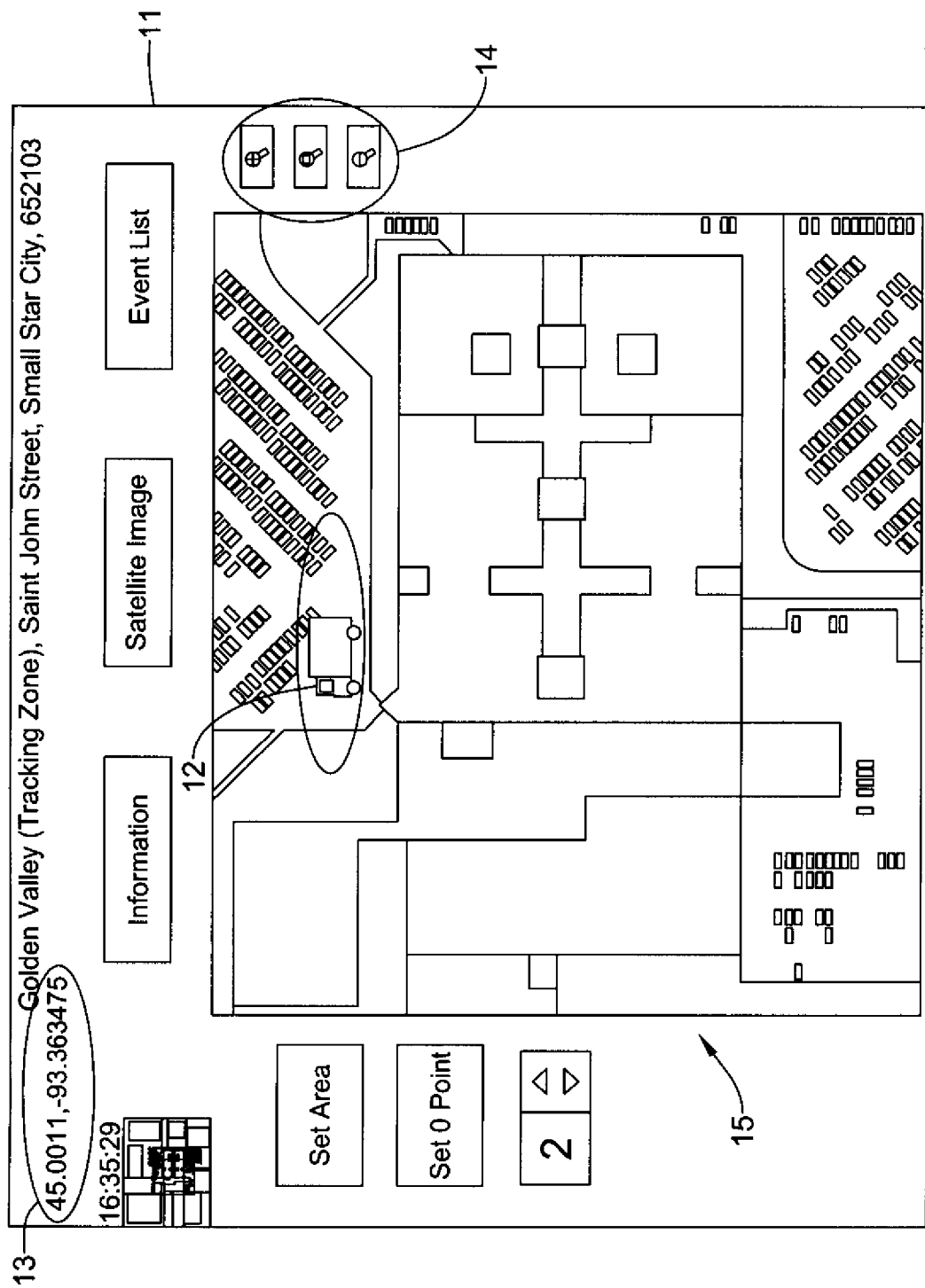
FIG. 1 is a diagram of a satellite image of a building structure for which information is to be discovered.

While some modern buildings provide digital or at least paper floor plans/maps to local fire departments, many legacy buildings still do not. Firefighters arriving on the scene may be forced to assess a fire situation with little or no information about the interior building structure except perhaps from what they might recall from a previous experience at the building. What is needed is a way to automatically derive an approximation of the interior structure from data artifacts available at the scene.

The present approach is to first automatically derive the exterior structure of a building as a wireframe or 3D floor plan using a shape extraction processing on public source images of the building, such as Google Earth™ (Google Earth). If a public data source also includes a perspective view image of the building, then one may discover from windows and other features of the building, the number and positioning of the interior floors of the building. Going further, one may then discover the approximate locations of various interior building structures such as stairways, elevators, hallways and other types of spaces from the locations and movements of firefighters reported by a location tracking system, and fire alarm system data.

One may track a firefighter with an IMU (inertial measurement unit) via dead reckoning, RSSI (received signal strength index), or the like. Now, for example, if there is no sign of body movement (from the IMU on the firefighter), but the firefighter moves from one floor to another, then one may assume an elevator at that location. If the IMU indicates movement and the firefighter moves from one floor to another, then the firefighter may be at a stairway. Straight line movement is probably a hallway. A short digression off the path to the side may indicate a room.

From addressable smoke and heat sensor data, one may obtain the location and identity of building spaces that are in alarm. One may add these items to the emerging knowledge of the interior structure.

One may then draw these internal structures that have been discovered onto the floors and the 3D exterior wireframe boundary of the building derived from the shape extraction. One may automatically insert the locations of activated smoke and heat detectors into the emerging 3D graphic of the building, as well as any other artifacts of interest to the incident commander that can be detected or reported.

One may note that in this concept, the picture of the building evolves during the incident as more tracks are reported by the tracking system and more alarms go off.

One may be able to generate 3D maps in real-time from data collected on-scene. For instance, if one is the incident commander arriving at the scene and has no building plan available, then one needs to be able to generate a 3D building plan, even if it is crude or coarse. There may be only several ways to do this. The "data collected on site" may be: 1) a sketch of the building in that the incident commander might try to do quickly, perhaps on a digitizer pad; 2) One might take photographs or video of the building; or 3) One might pull down the Google Earth images of the building (very coarse in resolution).

From the photos or Google Earth images, one may extract some features of the building exterior. One may even infer how many floors the building has from the placement of the windows. One may capture the main entrances. One may use the scale of the image to estimate building dimensions. From a drawing on a digitizer pad, one may do similar things. Thus, one may draw up a shell of a building populated with a certain number of blank floors.

One may generate the building exterior from a sketch on the digitizer pad, photos and a Google Earth image. As to an inside of a building, one may infer certain things from tracking data. If there is no sign of body movement (according to the IMU on the firefighter) and the firefighter can move from one floor to another, then one may assume an elevator to be in the building. If the IMU indicates movement and the firefighter moves from one floor to another, then a stairway may be assumed. Straight line movement may imply a hallway. A short digression off the path to the side may imply a room.

One may deduce more information (inside the structure) via a fusing of data (body movement from an IMU plus body location). One may then draw an internal structure on the exterior boundary.

One may track the firefighter with an IMU (inertial measurement unit) via dead reckoning. One may also track the firefighter with an RSSI (received signal strength index) via a nearest neighbor lookup (NNL), and other items. Some of these items may have disadvantages. The IMU appears to suffer from accumulated error and the RSSI appears to suffer from a dynamic environment, such as temperature and humidity, and so on. However, combining these items may result in a tracking system.

Additionally, "data collected on site" may also incorporate a firefighter's location, triggered alarms, and so on. So in this case, the 3D map may overlay these data on the building plan in real time. It is important to let the first command browse numerous information overlays on the 3D map.

FIG. 1 is a diagram of a satellite image 11 of the building structure to be discovered and displayed from various data artifacts. The longitude and latitude 13 may be obtained from a GPS (global positioning system) device. The satellite image 11 may be displayed and saved. A symbol 12 representing a truck of the first responder is shown on the image 11. The image may be panned and zoomed in and out with buttons 14 to get the destination which may be a building structure 15.

Figure 2:
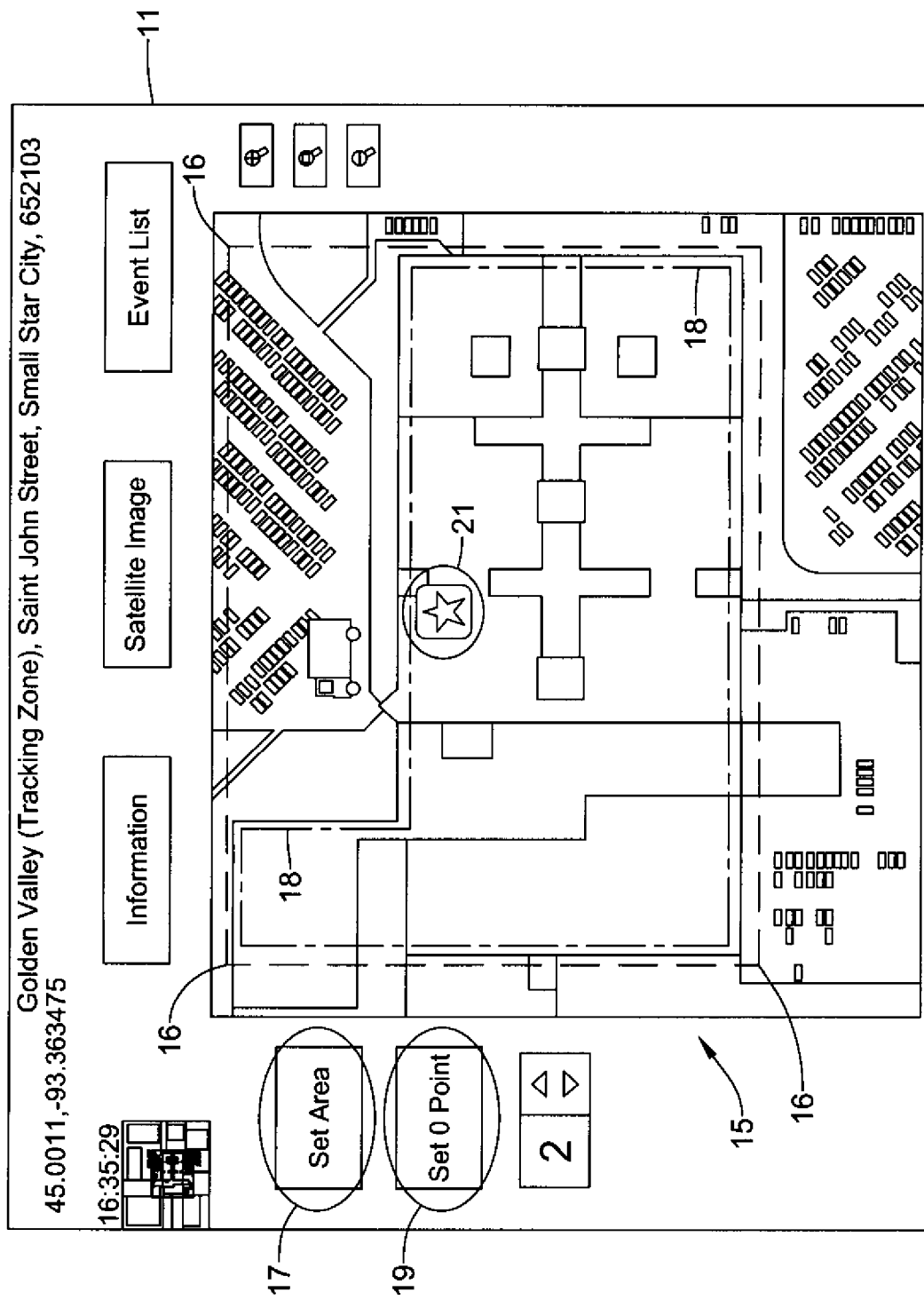
FIG. 2 is a diagram of the satellite image with an outline of the building structure delineated.

FIG. 2 is a diagram of satellite image 11 of structure 15 with a structure area selected with a dashed line rectangle 16, using a button 17 labeled "Set Area". An image process module may refine the boundary of building 15 of FIG. 2 with a color or a boundary 18. A "Set O Point" button 19 may be for setting an origin point 21 of a tracking system.

Figure 3:
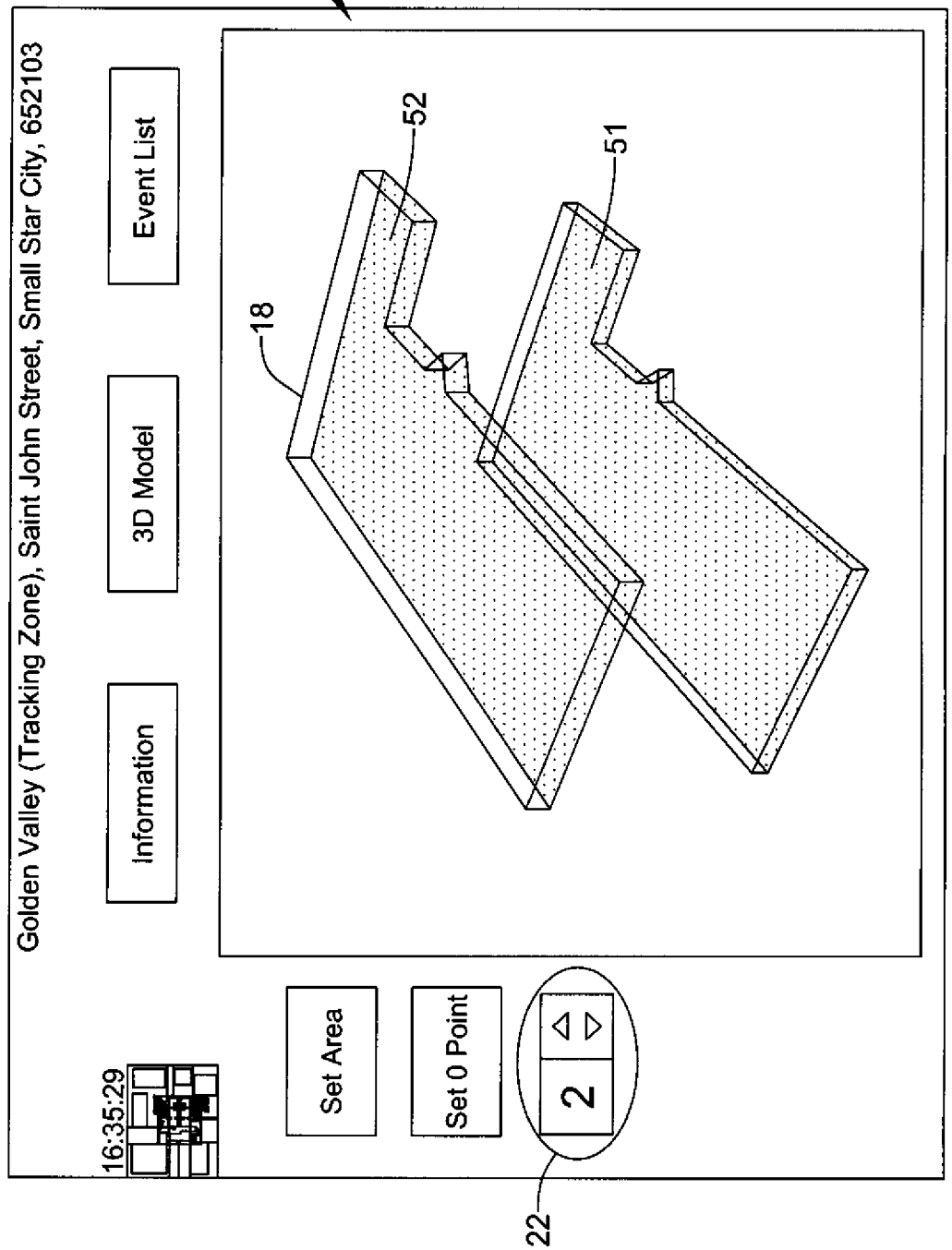
FIG. 3 is a diagram of a generated 3D floor plan of the building structure.

FIG. 3 is a diagram showing a generation of a 3D floor plan from structure 15 of FIG. 2. A "spine button" 22 may be pressed to set a number of floors. Button 22 may be pressed to show "2". With boundary 18 and the number of floors being two, the 3D model, floor plan or wireframe 23 of structure 15 may be generated and displayed.

Figure 4:
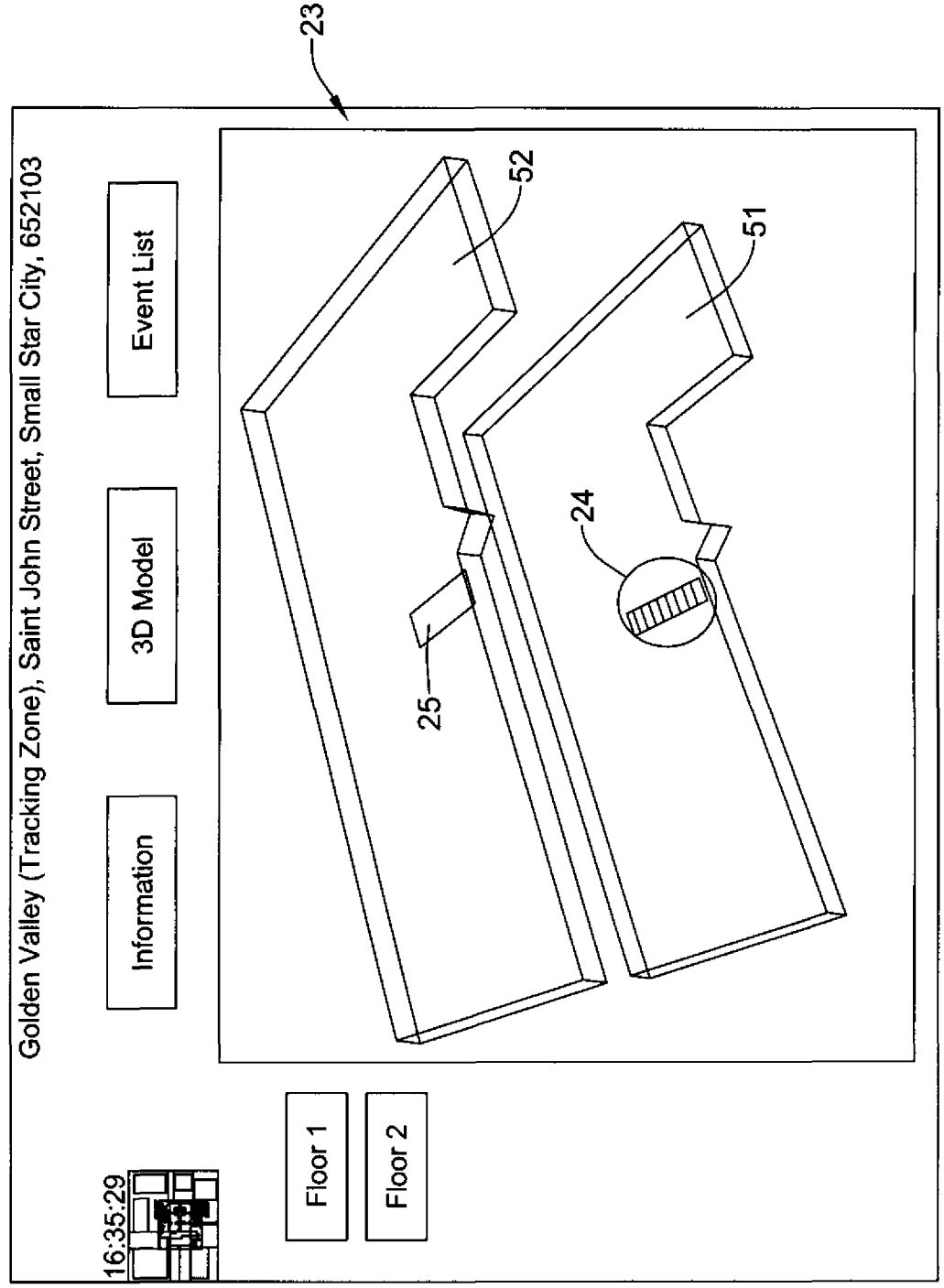
FIG. 4 is a diagram of the generated 3D floor plan with a structure component added.

FIG. 4 is a diagram of the 3D floor plan 23 from FIG. 3 but shows an adding of a structure shown with a symbol 24 on a first floor 51. For example, when a stair is identified, the 3D model 23 may be updated by adding the stair represented by symbol 24. When an elevator is identified, 3D model 23 may likewise be updated with a symbol 25 representing the elevator on a second floor 52. Other structures and items of building 15 may similarly be represented with a placement of symbols in appropriate places on the 3D model 23 floor plan.

Figure 5:
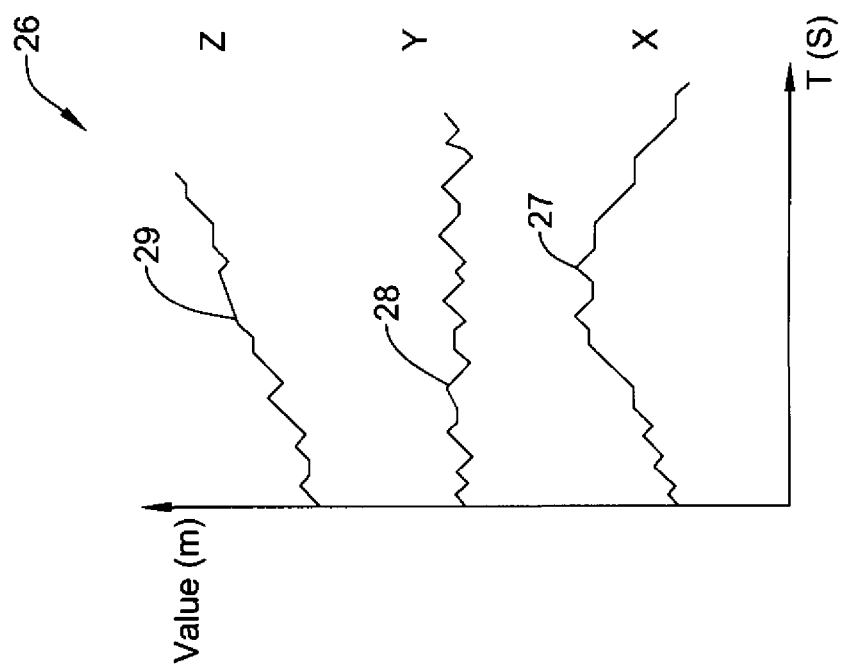
FIG. 5 is a graph revealing a motion of a person in a building structure from three different axes.
Figure 6:
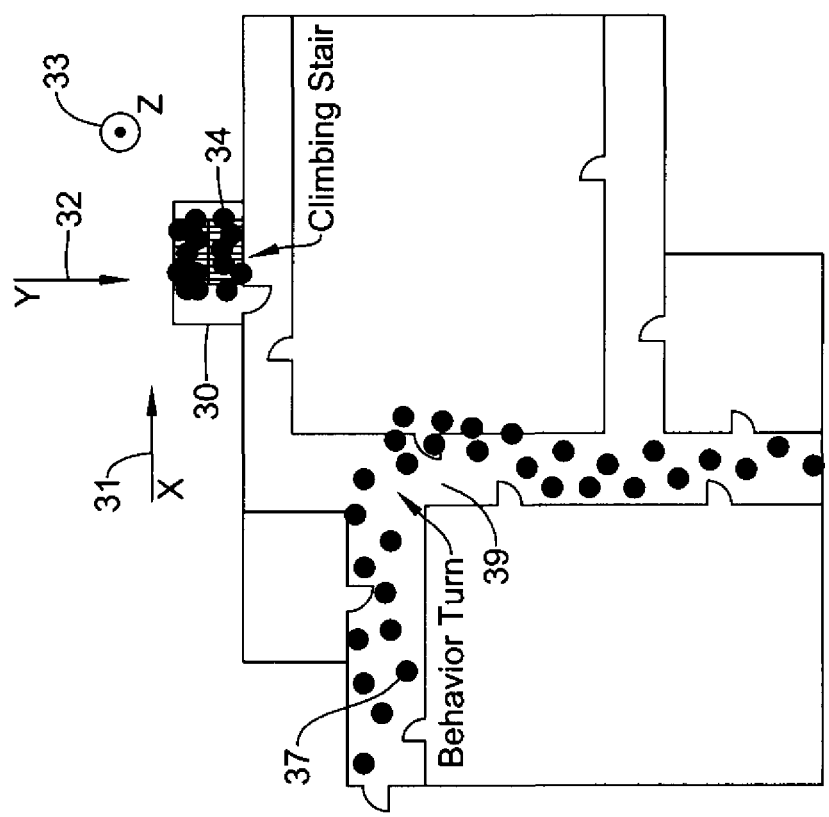
FIG. 6 is a diagram of the motion of a person as locations shown on a 2D floor plan.

FIG. 5 is a graph 26 showing the motion of, for example, a person climbing from views of the X, Y and Z axes. The graph is in terms of value (distance) versus time. The X axis movement is shown by plot 27 which may represent motion on a stairway 30 represented in a 2D floor plan in FIG. 6 in the direction of an arrow 31. The Y axis movement is shown by plot 28 which may represent motion on stairway in the direction of an arrow 32. The Z axis movement is shown by plot 29 which presents motion on the stairway 30 in the direction of arrow 33 coming out of the diagram at 90 degrees relative to the surface of the diagram. The dots 34 may represent positions of, for example, a person climbing the stairs 30.

Figure 7:
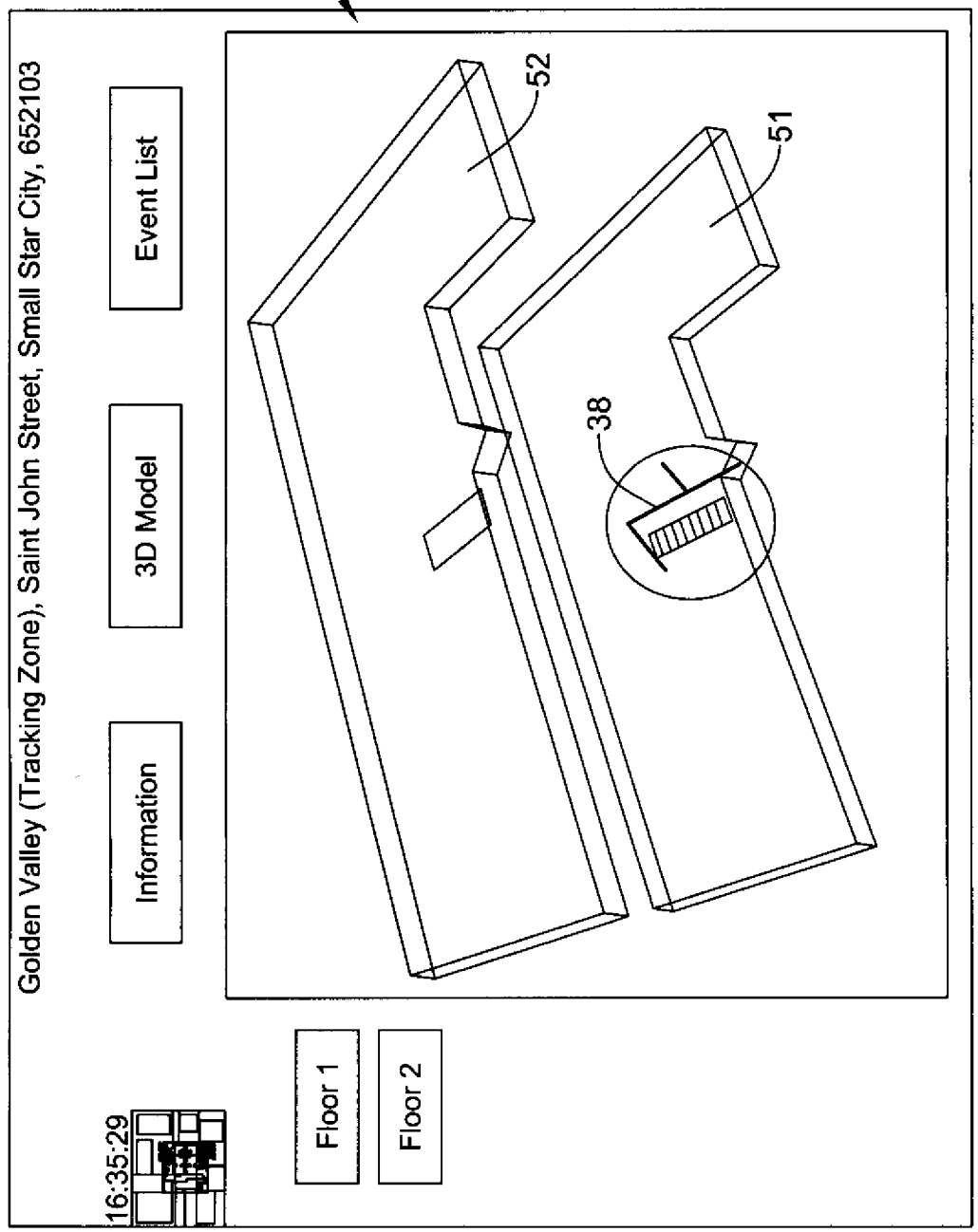
FIG. 7 is a diagram of the 3D floor plan with a symbol entered representing a structure component.
Figure 8:
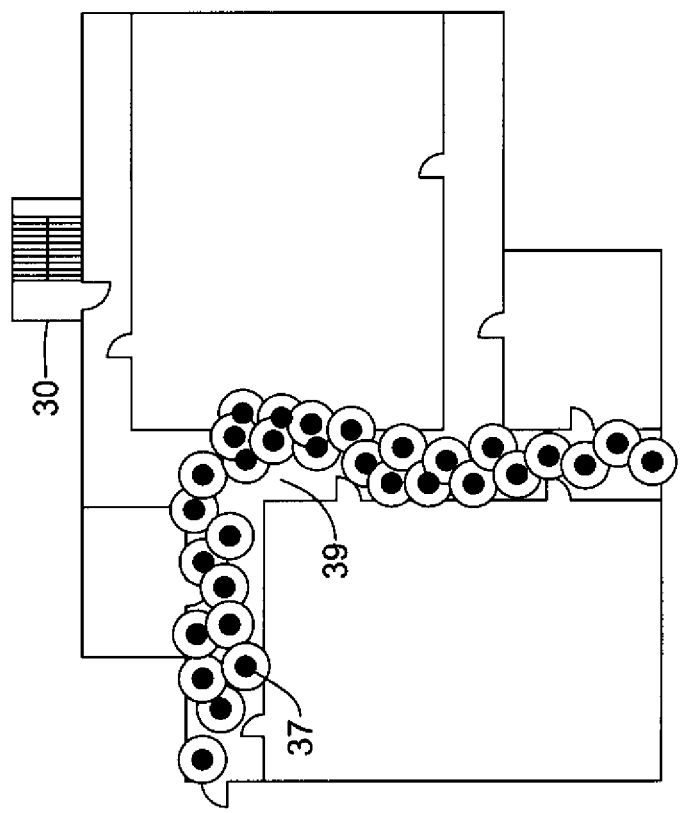
FIG. 8 is a diagram of the 2D floor plan indicating an identification of a hallway or path with locations having some distribution entered as symbols.
Figure 10:
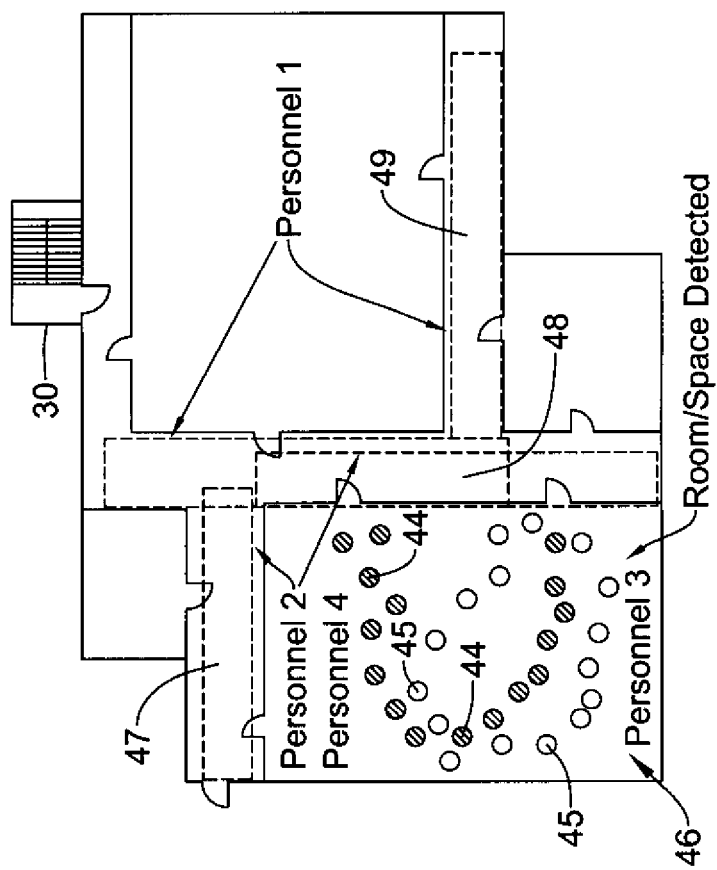
FIG. 10 is a diagram indicating an inference of structural components from data fusion.

FIG. 7 is a diagram of the 3D floor plan 23 showing an introduction on floor 51 of a symbol representing a hallway or hallways 38 once inferred or discovered as indicated in FIGS. 8 and 10.

Features of the structure of a building may be had from behavior definition and identification. Features of possible behaviors that can be identified may incorporate climbing stairs, as noted herein, turning left and/or right 90 degrees, travel in an elevator via acceleration, walking in a room, and so forth. FIG. 8 shows positions, represented by dots 37, of a person reflecting a behavior, which may indicate an existence of a hallway 39 with a 90 degree corner. Various behaviors with different features from the trajectory of personnel may be detected. Building structures may be deduced from the behaviors. A Markov-Model may be applied to analyze the time series data and then identify a behavior.

When a hallway or path is identified, the 3D floor plan 23 may be updated with the hallway or path 39 as shown in FIG. 8. An approach for identifying a hallway or path in a floor is shown. The dots or locations 37 may be put on an image or floor plan with a boundary, i.e., each location has some distribution (e.g., Gaussian distribution). The image or floor plan may be analyzed to get the hallway or path into the plan. The distribution of each location may be added. The image or plan may be normalized. Then some value beyond a certain threshold may be identified as indicating a hallway or a path.

Figure 9:
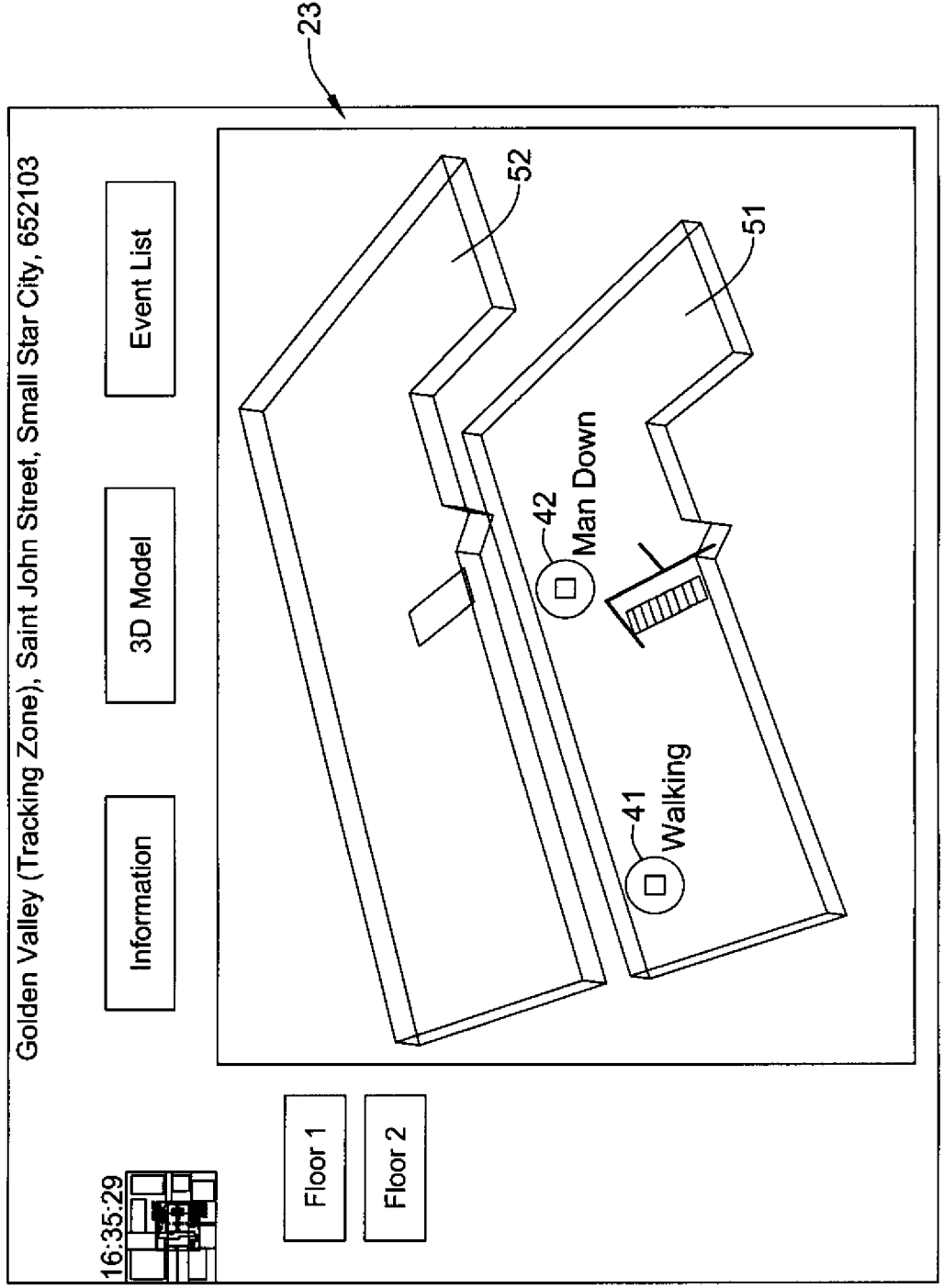
FIG. 9 is a 3D floor plan having symbols that represent objects and associated behaviors.

An object and its behaviors may be added to a floor plan of the 3D floor plan 23 in FIG. 9. For instance, an object may be added to its corresponding location. Various behaviors or roles may be represented with a distinct style such as a person walking 41, a person down 42, a lead person or a member, and so on. These items of information may be deduced from tracking data.

FIG. 10 is a diagram showing that more high level information may be integrated from data fusion. Data fusion may incorporate trajectories of a person at different times, trajectories of different personnel, and data from different sensors (e.g., RSSI or inertia measurement). Fusion strategies may incorporate an intersection when the data are similar, and a union when the data are anisotropic. Multiple trajectories may output information such as identifying rooms. For instance, personnel of locations 44 and personnel of locations 45 may identify or result in detection of a room or space 46. Personnel reflected by other locations may identify or result in detection of hallways 47, 48 and 49.

Relevant patent documents may include U.S. Pat. No. 7,683,793, issued Mar. 23, 2010, and entitled "Time-Dependent Classification and Signaling of Evacuation Route Safety"; U.S. patent application Ser. No. 12/200,158, filed Aug. 28, 2008, and entitled "Method of Route Retrieval"; and U.S. patent application Ser. No. 12/573,398, filed Oct. 5, 2009, and entitled "Location Enhancement System and Method Based on Topology Constraints". U.S. Pat. No. 7,683,793, issued Mar. 23, 2010, is hereby incorporated by reference. U.S. patent application Ser. No. 12/200,158, filed Aug. 28, 2008, is hereby incorporated by reference. U.S. patent application Ser. No. 12/573,398, filed Oct. 5, 2009, is hereby incorporated by reference.

In the present specification, some of the matter may be of a hypothetical or prophetic nature although stated in another manner or tense.

Although the present system has been described with respect to at least one illustrative example, many variations and modifications will become apparent to those skilled in the art upon reading the specification. It is therefore the intention that the appended claims be interpreted as broadly as possible in view of the prior art to include all such variations and modifications.

What is claimed is:

1. A method implemented in a computing device for generating a quick approximation of a building structure and displaying the generated building structure on a display connected to the computing device, comprising:

downloading a publicly available resource image of a structure with the computing device;

creating a structure outline with the computing device from the downloaded resource image;

setting the number of floors of the structure outline from a perspective view of the resource image or other source through interacting with a feature displayed on the display;

generating a 3D floor plan of the structure with the computing device from the structure outline and the set number of floors;
displaying the generated 3D floor plan of the structure and positions of emergency service personnel within the structure on the display;
adding distributions of the positions of the emergency service personnel within the structure to the floor plan;
normalizing the floor plan with the distributions of the positions of the emergency service personnel thereon;
determining various behaviors of the emergency service personnel with the computing device from trajectories of the emergency service personnel within the structure;
identifying components of the structure with the computing device from the determined various behaviors of the emergency service personnel; and
updating the 3D floor plan on the display to show components of the structure as they are discovered with the computing device; and
wherein the distributions of the positions of the emergency service personnel on the normalized floor plan are compared to some identified threshold to identify components of the structure.

2. The method of claim 1, further comprising:
selecting a button on the display to set an origin point of a tracking system and register the 3D floor plan to the tracking system.

3. The method of claim 1, further comprising:
identifying components of the structure with the computing device from the emergency service personnels' positions and/or movements in the structure as tracked with a tracking system in communication with the computing device; and
wherein:
emergency service people wear location equipment that transmits their locations in the structure to the computing device; and
movements are deduced from the locations.

4. The method of claim 3, wherein:
trajectories of persons are identified by the computing device from the locations of the emergency service people;
components of the structure are identified from data fusion by the computing device; and
data fusion comprises:
  trajectories of a person at different times; and/or
  trajectories of different persons as data from various sensors.

5. The method of claim 4, wherein multiple trajectories identify rooms and hallways of the structure.

6. The method of claim 1, wherein the distribution of the positions of the emergency service personnel is a Gaussian distributions.

7. A method implemented in a computing device having a processor for generating a building structure and displaying the generated building structure on a display, comprising:
displaying features of an exterior of a building on the display;
setting the number of floors of the building with the computing device based on the displayed features of the exterior of the building;
generating a 3D floor plan of the building with the computing device from exterior features of the building and the set number of floors;
displaying the generated 3D floor plan of the building on the display with the computing device;
identifying time series data of trajectories of personnel within the building with the computing device;
identifying components of the building with the computing device by applying a Markov model, with the computing device, to the identified time series data to identify personnel behavior and deduce the components of the building from the identified personnel behavior; and
updating the generated 3D floor plan of the building to add the identified components to the 3D floor plan of the building with the computing device as the components are identified; and
wherein components of the building are identified by the computing device when distributions of locations and movements of the personnel within the building reach a threshold value indicating the locations and movements are associated with a component of the building structure.

8. The method of claim 7, wherein identifying time series data of trajectories of personnel within the building comprises:
tracking the personnel within the building with a tracking system providing locations and movements of the personnel in three axes to the computing device.

9. The method of claim 7, further comprising:
obtaining an image of the building with the computing device;
generating features of an exterior of the building from the image with the computing device, and
wherein displaying features of an exterior of the building on the display comprises displaying the computing device generated features of the exterior of the building on the display.

10. The method of claim 9, wherein obtaining an image of the building with the computing device comprises drawing a sketch of the building on a digitizer pad, taking photographs or video of the building, and/or downloading an image of the building from a publicly available resource.

11. The method of claim 7, wherein components of the building comprise one or more of a hallway, a stairway, an elevator, a doorway, and a wall.

12. A method implemented in a computing device for generating a quick approximation of features of a building structure and displaying the generated building structure on a display connected to the computing device, comprising:
generating a 3D floor plan of a building structure with a computing device;
displaying the generated 3D floor plan of the structure and positions of emergency service personnel within the building structure on the display;
determining various behaviors of the emergency service personnel by applying, with the computing device, a Markov model to time series data indicating trajectories of the emergency service personnel within the building structure;
identifying features of the building structure with the computing device from the determined various behaviors of the emergency service personnel; and
updating the 3D floor plan on the display to show features of the structure as they are discovered with the computing device; and
wherein features of the building structure are identified by the computing device when a distribution of locations and movements of the personnel within the building reach a threshold value indicating the locations and movements are associated with a component of the building structure.

13. The method of claim 12, wherein:
the time series data indicating trajectories of the emergency personnel within the building structure includes locations of the emergency service personnel in the building structure.

* * * * *